US012265759B2

United States Patent
Li et al.

(10) Patent No.: US 12,265,759 B2
(45) Date of Patent: Apr. 1, 2025

(54) IMAGE CONSTRUCTION METHOD AND SYSTEM FOR HEATING AREA

(71) Applicant: HUANENG (TIANJIN) ENERGY SALES CO., LTD., Tianjin (CN)

(72) Inventors: Xuliang Li, Tianjin (CN); Zexuan Yu, Tianjin (CN); Xueqiang Han, Tianjin (CN); Guojun Wang, Tianjin (CN); Di Wu, Tianjin (CN); Shunyong Shi, Tianjin (CN); Zhenxing Yuan, Tianjin (CN); Hongjian Zuo, Tianjin (CN); Liangge Yu, Tianjin (CN); Sheng Ding, Tianjin (CN); Yi Zheng, Tianjin (CN); Ziyu Gong, Tianjin (CN); Rui Wang, Tianjin (CN); Weizheng Yang, Tianjin (CN)

(73) Assignee: HUANENG (TIANJIN) ENERGY SALES CO., LTD., Tianjin (CN)

( * ) Notice: Subject to any disclaimer, the term of this patent is extended or adjusted under 35 U.S.C. 154(b) by 0 days.

(21) Appl. No.: 18/757,364

(22) Filed: Jun. 27, 2024

(65) Prior Publication Data
US 2024/0403512 A1 Dec. 5, 2024

Related U.S. Application Data

(63) Continuation of application No. PCT/CN2024/094856, filed on May 23, 2024.

(30) Foreign Application Priority Data

May 30, 2023 (CN) .......................... 202310620097.5

(51) Int. Cl.
*F24D 10/00* (2022.01)
*G06F 30/18* (2020.01)

(52) U.S. Cl.
CPC .............. *G06F 30/18* (2020.01); *F24D 10/00* (2013.01)

(58) Field of Classification Search
CPC ...... F24D 10/003; F24D 10/00; F24D 10/006; G06F 30/18
See application file for complete search history.

(56) References Cited

U.S. PATENT DOCUMENTS

| | | | |
|---|---|---|---|
| 2009/0034996 | A1 | 2/2009 | Goto |
| 2013/0058691 | A1 | 3/2013 | Yonekawa |

(Continued)

FOREIGN PATENT DOCUMENTS

| | | |
|---|---|---|
| CN | 205746051 U | 11/2016 |
| CN | 110033024 A | 7/2019 |

(Continued)

OTHER PUBLICATIONS

Notification to Grant Patent Right for Invention in Chinese Application No. 202310620097.5 mailed on Jul. 11, 2023, 9 pages.

(Continued)

*Primary Examiner* — Nael N Babaa
(74) *Attorney, Agent, or Firm* — Porus IP LLC

(57) ABSTRACT

An image construction method and system for a heating area is provided. The method includes: obtaining an initial image according to a heating structure diagram and a building structure diagram of the heating area; segmenting the initial image according to heating attribute of the heating area to obtain a plurality of segmentation sub-graphs; performing first collection on a surface temperature of a heating pipeline according to pre-deployed surface devices corresponding to the segmentation sub-graphs, and setting first heating labels corresponding to the segmentation sub-graphs, and meanwhile, performing second collection on a regional temperature of a sub-area of the heating pipeline being located (Continued)

according to a pre-deployed monitoring device corresponding to the segmentation sub-graphs, and setting second heating labels; performing position and temperature analysis on a label setting result of each of the segmentation sub-graphs to obtain a heating image of the heating area.

4 Claims, 2 Drawing Sheets

(56) References Cited

U.S. PATENT DOCUMENTS

| | | |
|---|---|---|
| 2019/0187678 A1 | 6/2019 | Muinda et al. |
| 2019/0301963 A1 | 10/2019 | Yoshikawa et al. |
| 2020/0348662 A1 | 11/2020 | Cella et al. |
| 2022/0350278 A1 | 11/2022 | Wilsher et al. |

FOREIGN PATENT DOCUMENTS

| | | |
|---|---|---|
| CN | 110245411 A | 9/2019 |
| CN | 111059612 A | 4/2020 |
| CN | 112964370 A | 6/2021 |
| CN | 213361936 | 6/2021 |
| CN | 113345049 A | 9/2021 |
| CN | 113888737 A | 1/2022 |
| CN | 116341087 A | 6/2023 |

OTHER PUBLICATIONS

Zhao, Longcan, Research on Test Technology of Heating Pipeline Based on Magnetic-Temperature Gradient, China Master's Theses Full-text Database, 2017, 76 pages.

Huang, Chih-Yung et al., Experimental study of heat transfer enhancement with segmented flow in a microchannel by using molecule-based temperature sensors, International Journal of Heat and Mass Transfer, 2017, 23 pages.

IMAGE CONSTRUCTION METHOD AND SYSTEM FOR HEATING AREA

CROSS-REFERENCE TO RELATED APPLICATIONS

This application is a continuation of PCT/CN2024/094856, filed May 23, 2024 and claims priority of Chinese Patent Application No. 202310620097.5, filed on May 30, 2023, the contents of which are hereby incorporated by reference.

TECHNICAL FIELD

The disclosure relates to the technical field of image construction, in particular to an image construction method and system for a heating area.

BACKGROUND

Although the urban underground pipe network is hidden under the ground, it is an important part of the city like the blood vessels and nerves of the human body. There are urban water supply and drainage, power lines, communication lines, heating and gas pipelines in the pipe network, which are important resources for urban planning, construction and management. Among them, taking the heating pipeline as an example, and all pipelines that transport steam or hot water are called heating pipelines.

In the daily construction process of heating pipelines, there will be problems such as pipeline leakage, but generally, the pipeline is tested manually on a regular basis to ensure the normal operation of the pipeline, or after receiving complaints from users, it may be because individual users can't receive the heating or the heating temperature is too low, so the pipeline detection will be carried out. That is to say, the temperature of the pipeline can not be obtained in real time, which leads to the low efficiency of pipeline detection.

Therefore, the disclosure provides an image construction method and system for a heating area.

SUMMARY

The disclosure provides an image construction method and system for a heating area, which are used for respectively setting different labels by collecting the surface temperature of a pipeline and the regional temperature of the area where the pipeline is located. And labels are attached and indexes are established on the corresponding images, so that the whole running situation of the pipeline can be viewed in time, and the detection efficiency of the pipeline can be improved conveniently.

The disclosure provides an image construction method for a heating area, the method includes:
  S1: performing image fusion to obtain an initial image of the heating area according to a heating structure diagram and a building structure diagram of the heating area;
  S2, segmenting the initial image according to heating attribute of the heating area to obtain a plurality of segmentation sub-graphs;
  S3, performing first collection on a surface temperature of a heating pipeline according to pre-deployed surface devices corresponding to the segmentation sub-graphs, and setting first heating labels corresponding to the segmentation sub-graphs, and meanwhile, performing second collection on a regional temperature of a sub-area of the heating pipeline being located according to a pre-deployed monitoring device corresponding to the segmentation sub-graphs, and setting second heating labels;
  S4, performing position and temperature analysis on a label setting result of each of the segmentation sub-graphs, establishing a heating mapping file, establishing a display index of the heating mapping file, and attaching the display index to the initial image to obtain a heating image of the heating area.

Optionally, the performing image fusion to obtain an initial image of the heating area according to the heating structure diagram and the building structure diagram of the heating area includes:
  obtaining a first scaling ratio of the heating structure diagram of the heating area and obtaining a second scaling ratio of the building structure diagram of the heating area;
  performing same scale processing on the first scaling scale and the second scaling scale, and performing position fusion on a same scale heating diagram and a same scale building diagram to obtain the initial image.

Optionally, the segmenting the initial image according to heating attribute of the heating area to obtain a plurality of segmentation sub-graphs includes:
  based on the initial image, performing a first determination on pipeline nodes of the heating pipeline, bifurcation connection information and bifurcation trend information of each of the pipeline nodes to obtain a first determination result, and performing a second determination on heating intention of each pipeline segment in the heating pipeline to obtain a second determination result;
  constructing a first array of each the pipeline segment according to the first determination result and the second determination result;
  determining whether a segment position of each the pipeline segment is an end point, and if so, adding an object parameter to the first array of corresponding pipeline segment to obtain a second array of corresponding pipeline segment;
  otherwise, keeping the first array unchanged;
  respectively inputting the first array and the second array into an array analysis model to obtain a segment state of each pipeline segment, and obtaining a continuous and consistent first state and an independent second state;
  segmenting the initial image according to matching positions of the first state and the second state to obtain the plurality of segmentation sub-graphs.

Optionally, the performing first collection on a surface temperature of a heating pipeline according to pre-deployed surface devices corresponding to the segmentation sub-graphs, and setting first heating labels corresponding to the segmentation sub-graphs includes:
  controlling each of the surface devices in a same one of the segmentation sub-graphs to collect a surface temperature at a corresponding position for $n1$ times, and constructing a first temperature matrix, where row vector of the first temperature matrix is a temperature value of $n1$ times collected by same one of the surface devices, and column vector of the first temperature matrix is a temperature value collected by different surface devices at a same time;
  performing row fitting on the first temperature matrix to obtain first fitting values, and simultaneously performing column fitting on the first temperature matrix to obtain second fitting values;

calculating a first standard deviation of all the first fitting values, a second standard deviation of all the second fitting values and a third standard deviation of all the first fitting values and all the second fitting values;

respectively obtaining fitting lines of absolute values of differences between the first standard deviation and the second standard deviation, the first standard deviation and the third standard deviation, and the second standard deviation and the third standard deviation;

if the fitting lines are same horizontally fitted, obtaining average temperatures of all the first fitting values and the second fitting values, and setting the first heating labels corresponding to the segmentation sub-graphs;

if the fitting lines are not horizontally fitted, extracting a temperature measurement result corresponding to a first segment from the first temperature matrix according to a segmentation trend of each first segment in the segmentation sub-graphs to obtain an initial sub-matrix;

removing a first row vector and a last row vector of the initial sub-matrix to obtain a first sub-matrix;

when the initial sub-matrix is consistent with feature information of the first sub-matrix, determining first temperatures to be marked corresponding to the first segment and a first position to be marked for each of the first temperatures to be marked according to a line state of a first line corresponding to the initial sub-matrix, to set a first sub-label for corresponding to the first segment;

when the initial sub-matrix is inconsistent with the feature information of the first sub-matrix, obtaining input water flow combination information corresponding to the first segment and performing first filling on the first row vector of the first sub-matrix, and performing second filling on the last row vector of the first sub-matrix according to the output water flow combination information corresponding to the first segment;

if a filled sub-matrix is consistent with feature information of a corresponding initial sub-matrix, determining a second temperature to be marked corresponding to the first segment and the second position to be marked for each second temperature according to a heating influence state of the input water flow combination information and the output water flow combination information, the line state of the first line corresponding to the initial sub-matrix and a line state of a second line corresponding to the first sub-matrix, to set a second sub-label for the corresponding first segment;

if the filled sub-matrix is inconsistent with the feature information of the corresponding initial sub-matrix, obtaining adjacent temperatures of adjacent segments connected with corresponding the first segment and averaging the adjacent temperatures, to set a third sub-label for corresponding the first segment;

according to a setting result of each first segment in same one of the segmentation sub-graphs, obtaining the first heating labels corresponding to the segmentation sub-graphs.

Optionally, the performing second collection on a regional temperature of a sub-area of the heating pipeline being located according to a pre-deployed monitoring device corresponding to the segmentation sub-graphs and setting second heating labels includes:

collecting a same external area temperature of each pipeline segment in the heating pipeline for n2 times based on the monitoring device;

performing fitting processing on collection results of the same external area temperature, and setting the second heating labels to a corresponding same external area.

Optionally, the performing position and temperature analysis on a label setting result of each of the segmentation sub-graphs, and establishing a heating mapping file includes:

obtaining all the first heating labels and all the second heating labels of each pipeline segment in same one of the segmentation sub-graphs, and constructing and obtaining a label array of corresponding pipeline segment;

performing temperature analysis on labels of same one of pipeline positions in the label array to calculate temperature reasonable values;

$$W1 = \left|\delta 1 \times \frac{G1 - Gc}{\Delta L1}\right| + \left|\delta 2 \times \frac{G1 - G2}{\Delta L2}\right|;$$

where G1 represents a temperature value corresponding to each of the first heating labels at same one of the pipeline positions; Gc represents a temperature value corresponding to each of the first heating labels with a nearest adjacent distance from the same one of the pipeline positions in a same pipeline segment; G2 represents a temperature value corresponding to each of the second heating labels at the same one of the pipeline positions; ΔL2 represents a temperature attenuation function at a distance L2 between a pipeline surface measurement point and an external area measurement point in a spatial vertical direction of the same one of the pipeline positions; ΔL1 represents a temperature attenuation function of two pipeline surface measurement points in a spatial horizontal direction at a distance L1; δ1 represents setting weight of horizontal attenuation; δ2 represents setting weight of vertical attenuation; W1 represents corresponding temperature reasonable values;

according to the temperature reasonable values and position importance of the same one of the pipeline positions, obtaining first significance marks of the same one of the pipeline positions from a value-position-mark mapping table;

constructing corresponding relationships between the first significance marks and the same one of the pipeline positions;

establishing a heating mapping file based on all the corresponding relationships.

Optionally, the establishing a display index of the heating mapping file, and attaching the display index to the initial image to obtain a heating image of the heating area includes:

determining hidden relationships between a first significance label of each the same one of the pipeline positions and a displayed click position in the heating mapping file;

establishing the display index of the heating mapping file according to all the hidden relationships;

attaching the display index to a hidden layer of the initial image to obtain the heating image of the heating area.

The disclosure provides an image construction system for a heating area, which includes:

an image construction module configured for performing image fusion to obtain an initial image of the heating area according to a heating structure diagram and a building structure diagram of the heating area;

an image segmentation module configured for segmenting the initial image according to heating attribute of the heating area to obtain a plurality of segmentation sub-graphs;

a label setting module configured for performing first collection on a surface temperature of a heating pipeline according to pre-deployed surface devices corresponding to the segmentation sub-graphs, and setting first heating labels corresponding to the segmentation sub-graphs, and meanwhile, performing second collection on a regional temperature of a sub-area of the heating pipeline being located according to a pre-deployed monitoring device corresponding to the segmentation sub-graphs, and setting second heating labels;

an image attaching module configured for performing position and temperature analysis on a label setting result of each of the segmentation sub-graphs, establishing a heating mapping file, establishing a display index of the heating mapping file, and attaching the display index to the initial image to obtain a heating image of the heating area.

Compared with the prior art, the beneficial effects of the disclosure are as follows:

different labels are respectively set by collecting the surface temperature of a pipeline and the regional temperature of the area where the pipeline is located; and labels are attached and indexes are established on the corresponding images, so that the whole running situation of the pipeline can be viewed in time, and the detection efficiency of the pipeline can be improved conveniently.

Other features and advantages of the disclosure will be set forth in the description which follows, and in part will be obvious from the description, or may be learned by practice of the disclosure. The objects and other advantages of the disclosure may be realized and obtained by the structure particularly pointed out in the written specification, claims, and appended drawings.

In the following, the technical scheme of the disclosure will be further described in detail through the attached drawings and embodiments.

BRIEF DESCRIPTION OF THE DRAWINGS

The accompanying drawings are provided to provide a further understanding of the disclosure and constitute a part of the specification. Together with the embodiments of the disclosure, they serve to explain the disclosure and do not constitute a limitation of the disclosure. In the attached drawings.

DETAILED DESCRIPTION OF THE EMBODIMENTS

Preferred embodiments of the disclosure will be described below in combination with the accompanying drawings. It should be understood that the preferred embodiments described here are only used to illustrate and explain the disclosure, and are not used to limit the disclosure.

Figure 1:
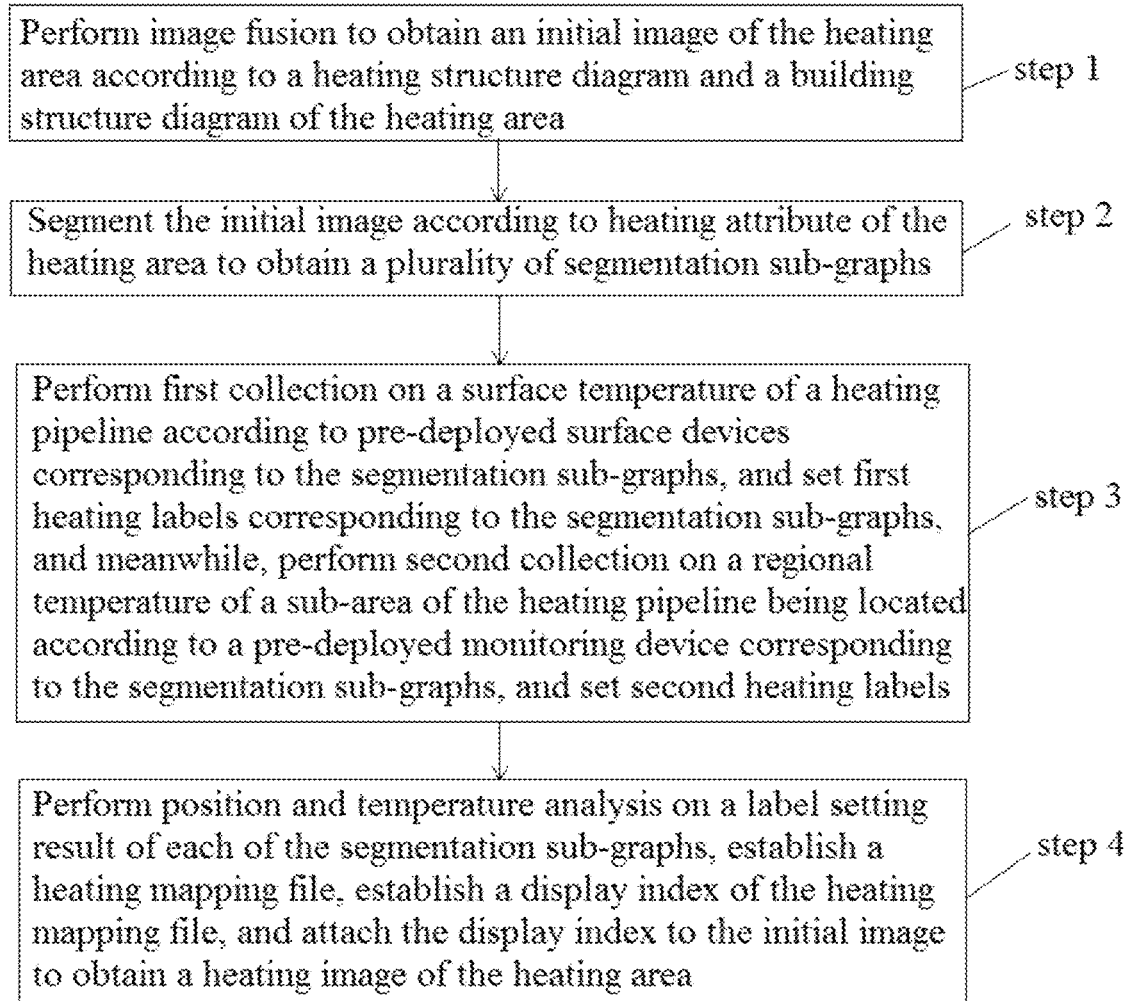
FIG. 1 is a flowchart of an image construction method for a heating area according to embodiments of the disclosure.

The disclosure provides an image construction method of a heating area, as shown in FIG. 1, including:

S1: image fusion is performed to obtain an initial image of the heating area according to a heating structure diagram and a building structure diagram of the heating area;

S2: the initial image is segmented according to heating attribute of the heating area to obtain a plurality of segmentation sub-graphs;

S3: first collection is performed on a surface temperature of a heating pipeline according to pre-deployed surface devices corresponding to the segmentation sub-graphs, and first heating labels corresponding to the segmentation sub-graphs are set, and meanwhile, second collection is performed on a regional temperature of a sub-area of the heating pipeline being located according to a pre-deployed monitoring device corresponding to the segmentation sub-graphs, and second heating labels are set;

S4, position and temperature analysis is performed on a label setting result of each of the segmentation sub-graphs, a heating mapping file is established, a display index of the heating mapping file is established, and the display index is attached to the initial image to obtain a heating image of the heating area.

In this embodiment, the object of the first collection is the surface temperature of the heating pipeline, and the object of the second collection is the temperature of the current environment where the heating pipeline is located. Because the heating pipeline is generally placed underground, the temperature in the area under the manhole cover or in the space area above the pipeline transportation area is measured, that is, the second collection.

In this embodiment, the heating structure diagram refers to the deployment position of heating pipeline in the heating area, and the building structure diagram refers to the deployment position of building houses in the heating area, where the heating area refers to a certain residential area.

In this embodiment, image fusion refers to presenting heating pipelines and building houses in one image, which is regarded as the initial image.

In this embodiment, the heating attribute refers to the heating trend, segment position and pipeline connection situation of different pipeline segments of the heating pipeline in the heating area, so as to facilitate the segmentation of the initial image. For example, there are pipeline segments 1, 2, 3 and 4 in the initial image, in which pipeline segment 1 is connected with pipeline segments 2 and 3, pipeline segment 3 is connected with pipeline segment 4, and pipeline segment 2 supplies heat to unit building 1, and pipeline segment 4 supplies heat to unit building 2. At this time, it can be segmented according to pipeline segment 1, pipeline segment 2 and pipeline segments 3 and 4 to obtain three segmentation sub-graphs.

In this embodiment, both the surface device and the detection device are temperature sensors.

In this embodiment, the first heating label refers to setting at least one label that can represent the surface temperature of the pipeline to the corresponding pipeline segment, and the second heating label refers to setting at least one label that can represent the corresponding space area temperature of the pipeline to the corresponding pipeline segment.

In this embodiment, position and temperature analysis refers to determining whether the temperature of two labels set at the same pipeline position of the corresponding pipeline segment is attenuated reasonably, and then determining whether the temperature of the pipeline position is normal or abnormal, which is convenient to display on the heating image.

In this embodiment, the heating mapping file includes the setting results of two labels corresponding to different pipeline positions and the temperature situation.

In this embodiment, the display index is used for the convenience of subsequent viewing, and the temperature at any position is displayed by clicking the mouse on any position of the image, which is convenient for timely viewing and understanding.

In this embodiment, the heating image is the initial image with the display index attached.

The technical scheme has the following beneficial effects: the different labels are respectively set by collecting the surface temperature of a pipeline and the regional temperature of the area where the pipeline is located, and labels are attached and indexes are established on the corresponding images, so that the whole running situation of the pipeline can be viewed in time, and the detection efficiency of the pipeline can be improved conveniently.

The disclosure provides the image construction method for a heating area, the performing image fusion to obtain an initial image of the heating area according to the heating structure diagram and the building structure diagram of the heating area includes:
  a first scaling ratio of the heating structure diagram of the heating area is obtained and a second scaling ratio of the building structure diagram of the heating area is obtained;
  same scale processing is performed on the first scaling scale and the second scaling scale, and position fusion is performed on a same scale heating diagram and a same scale building diagram to obtain the initial image.

In this embodiment, the first scaling ratio is 1:100, and the second scaling ratio is 1:50. At this time, the first scaling ratio is scaled to 1:50, or the second scaling ratio is scaled to 1:100, so as to realize the same scale processing.

The technical scheme has the following beneficial effects: through the same scale processing and position fusion, it is convenient to directly obtain the initial image of the heating area.

The disclosure provides the image construction method for a heating area, the segmenting the initial image according to heating attribute of the heating area to obtain a plurality of segmentation sub-graphs includes:
  based on the initial image, a first determination is performed on pipeline nodes of the heating pipeline, bifurcation connection information and bifurcation trend information of each of the pipeline nodes to obtain a first determination result, and a second determination is performed on heating intention of each pipeline segment in the heating pipeline to obtain a second determination result;
  a first array of each the pipeline segment is constructed according to the first determination result and the second determination result;
  whether a segment position of each the pipeline segment is an end point is determined, and if so, an object parameter is added to the first array of corresponding pipeline segment to obtain a second array of corresponding pipeline segment; otherwise, the first array is kept unchanged;
  the first array and the second array are respectively input into an array analysis model to obtain a segment state of each pipeline segment, and a continuous and consistent first state and an independent second state are obtained;
  the initial image is segmented according to matching positions of the first state and the second state to obtain the plurality of segmentation sub-graphs.

In this embodiment, there are pipeline segments 1, 2, 3 and 4 in the initial image, where pipeline segment 1 is connected with pipeline segments 2 and 3, pipeline segment 3 is connected with pipeline segment 4, and pipeline segment 2 supplies heat to unit building 1, and pipeline segment 4 supplies heat to unit building 2. At this time, the connection position of every two pipeline segments is regarded as the pipeline node, and the bifurcation connection information refers to the connection between pipeline segment 1 and pipeline segments 2 and 3, and the bifurcation trend refers to that pipeline segment 2 supplies heat to unit building 1, and pipeline segment 3 supplies heat to pipeline segment 4. The heating intention refers to that the pipeline segment 1 supplies heat to the unit building 1 and the unit building 2, the pipeline intention of pipeline segment 2 is to supply heat to unit building 1, the pipeline intention of pipeline segment 3 is to supply heat to pipeline segment 4, and the pipeline intention of pipeline segment 4 is to supply heat to unit building 2.

In this embodiment, the first array is: [the bifurcation connection information, the bifurcation trend information, the heating intention].

In this embodiment, the second array is: [the bifurcation connection information, the bifurcation trend information, the heating intention, the object parameter], if it is the end point, the corresponding object parameter can be specific to the location of the household room in the heating building.

In this embodiment, the array analysis model is pre-trained, and includes different array combinations and pipeline states matching the combinations, which are obtained by sample training, so effective segmentation sub-graphs can be obtained.

And the segmentation is generally performed according to the pipeline direction, or after the pipeline direction is determined, for example, the pipelines of all users' homes in the unit building 1 are taken as a segmentation sub-graph.

In this embodiment, the segment state refers to the current regional division state of the pipeline. For example, the pipeline segment 1 is in state 1, the pipeline segment 2 is in state 2, and the pipeline segments 3 and 4 are in state 3. At this time, it can be divided into three segmentation sub-graphs.

The technical scheme has the following beneficial effects: by obtaining the array and analyzing the array by the model, the initial image is divided according to the state, and then a plurality of segmentation sub-graphs are obtained, which provides a basis for subsequent timely viewing.

The disclosure provides the image construction method for a heating area, performing first collection on a surface temperature of a heating pipeline according to pre-deployed surface devices corresponding to the segmentation sub-graphs, and setting first heating labels corresponding to the segmentation sub-graphs includes:
  each of the surface devices in a same one of the segmentation sub-graphs is controlled to collect a surface temperature at a corresponding position for $n1$ times, and a first temperature matrix is constructed, where row vector of the first temperature matrix is a temperature value of $n1$ times collected by same one of the surface devices, and column vector of the first temperature matrix is a temperature value collected by different surface devices at a same time;

row fitting is performed on the first temperature matrix to obtain first fitting values, and simultaneously column fitting is performed on the first temperature matrix to obtain second fitting values;

a first standard deviation of all the first fitting values, a second standard deviation of all the second fitting values and a third standard deviation of all the first fitting values and all the second fitting values are calculated;

fitting lines of absolute values of differences between the first standard deviation and the second standard deviation, the first standard deviation and the third standard deviation, and the second standard deviation and the third standard deviation are respectively obtained;

if the fitting lines are same horizontally fitted, average temperatures of all the first fitting values and the second fitting values are obtained, to set the first heating labels corresponding to the segmentation sub-graphs;

if the fitting lines are not horizontally fitted, a temperature measurement result corresponding to a first segment is extracted from the first temperature matrix according to a segmentation trend of each first segment in the segmentation sub-graphs to obtain an initial sub-matrix;

a first row vector and a last row vector of the initial sub-matrix are removed to obtain a first sub-matrix;

when the initial sub-matrix is consistent with feature information of the first sub-matrix, first temperatures to be marked corresponding to the first segment and a first position to be marked for each of the first temperatures to be marked are determined according to a line state of a first line corresponding to the initial sub-matrix, to set a first sub-label for corresponding to the first segment;

when the initial sub-matrix is inconsistent with the feature information of the first sub-matrix, input water flow combination information corresponding to the first segment is obtained and first filling is performed on the first row vector of the first sub-matrix, and second filling is performed on the last row vector of the first sub-matrix according to the output water flow combination information corresponding to the first segment;

if a filled sub-matrix is consistent with feature information of a corresponding initial sub-matrix, a second temperature to be marked corresponding to the first segment and the second position to be marked for each second temperature are determined according to a heating influence state of the input water flow combination information and the output water flow combination information, the line state of the first line corresponding to the initial sub-matrix and a line state of a second line corresponding to the first sub-matrix, to set a second sub-label for the corresponding first segment;

if the filled sub-matrix is inconsistent with the feature information of the corresponding initial sub-matrix, adjacent temperatures of adjacent segments connected with corresponding the first segment are obtained and the adjacent temperatures are averaged, to set a third sub-label for corresponding the first segment;

according to a setting result of each first segment in same one of the segmentation sub-graphs, the first heating labels corresponding to the segmentation sub-graphs are obtained.

In this embodiment, each row vector is fitted according to the fitting formula, that is, row fitting, and the result obtained is a first fitting value, and each column vector is fitted according to the fitting formula, that is, column fitting, and the result obtained is a second fitting value.

In this embodiment, the standard deviation is calculated according to the standard deviation formula, and the basic values are different, so the calculated standard deviation may be different.

In this embodiment, the fitting line refers to fitting the absolute values of three differences to determine, and the fitting line can be horizontal or non-horizontal, so as to set corresponding labels, and the labels represent different temperatures at different positions. If there is only one position and one temperature for the corresponding pipeline segment, it represents that every position on the pipeline segment has the same temperature setting, and the first segment is the corresponding pipeline segment.

In this embodiment, if there are multiple positions and multiple temperatures, only the temperatures of multiple positions and corresponding positions are represented.

In this embodiment, the initial sub-matrix is actually a part of the first temperature matrix, because the first temperature matrix is aimed at the whole segmentation sub-graphs, and the initial sub-matrix may only be aimed at a certain pipeline segment.

In this embodiment, the feature information is determined based on the matrix temperature arrangement, such as temperature decrease, temperature increase, temperature unchanged, etc.

In this embodiment, the first line refers to a fitting line obtained by processing the initial sub-matrix in a same way as the first temperature matrix, and the second line is similar to the first line, which will not be described here.

In this embodiment, the temperature to be marked and the position to be marked are in one-to-one correspondence.

In this embodiment, different sub-labels include position and temperature.

In this embodiment, the input water flow combination information refers to the input connected pipeline segment for the pipeline segment 1, and when there are a plurality of input connected pipeline segments, there may be a situation that the input heating temperatures are different, which will further cause unreasonable measurement of the temperature at the initial position of the pipeline segment 1. And that output water flow combination information is similar to the input water flow combination information, which is the connected pipeline segment after the output of the pipeline segment 1. And there are several connected pipeline segments after output, it will cause unreasonable measurement of the end temperature of pipeline segment 1 due to different temperatures.

The technical scheme has the advantages as follows: the surface temperature is collected for many times, a temperature matrix is constructed, and then the matrix is performed to row fitting, column fitting and standard deviation calculation, so that the heating label is set according to the obtained fitting line. In the case of non-horizontal fitting, by the detailed refinement of the segmentation sub-graphs to attribute to each pipeline segment, the labels that need to be set in different pipeline segments can be effectively determined, and then the rationality of pipeline label setting in the segmentation sub-graphs can be realized, which provides a basis for subsequent viewing and detection, and then improves efficiency.

The disclosure provides the image construction method for a heating area, performing second collection on a regional temperature of a sub-area of the heating pipeline being located according to a pre-deployed monitoring device corresponding to the segmentation sub-graphs and setting second heating labels includes:
- a same external area temperature of each pipeline segment in the heating pipeline is collected for n2 times based on the monitoring device;
- fitting processing is performed on collection results of the same external area temperature, and the second heating labels is set to a corresponding same external area.

In this embodiment, temperature measurement is required at each external position of the external area of each pipeline segment, so that the corresponding label array can be effectively obtained when the subsequent mapping file is established.

The technical scheme has the following beneficial effects: by fitting the temperature of the external area of the pipeline, it is convenient to set the label and provide a basis for the subsequent construction of heating images.

The disclosure provides the image construction method for a heating area, performing position and temperature analysis on a label setting result of each of the segmentation sub-graphs, and establishing a heating mapping file includes:
- all the first heating labels and all the second heating labels of each pipeline segment in same one of the segmentation sub-graphs are obtained, and a label array of corresponding pipeline segment is constructed and obtained;
- temperature analysis is performed on labels of same one of pipeline positions in the label array to calculate temperature reasonable values;

$$W1 = \left| \delta 1 \times \frac{G1 - Gc}{\Delta L1} \right| + \left| \delta 2 \times \frac{G1 - G2}{\Delta L2} \right|;$$

where G1 represents a temperature value corresponding to each of the first heating labels at same one of the pipeline positions; Gc represents a temperature value corresponding to each of the first heating labels with a nearest adjacent distance from the same one of the pipeline positions in a same pipeline segment; G2 represents a temperature value corresponding to each of the second heating labels at the same one of the pipeline positions; ΔL2 represents a temperature attenuation function at a distance L2 between a pipeline surface measurement point and an external area measurement point in a spatial vertical direction of the same one of the pipeline positions; ΔL1 represents a temperature attenuation function of two pipeline surface measurement points in a spatial horizontal direction at a distance L1; δ1 represents setting weight of horizontal attenuation; δ2 represents setting weight of vertical attenuation; W1 represents corresponding temperature reasonable values;
- according to the temperature reasonable values and position importance of the same one of the pipeline positions, first significance marks of the same one of the pipeline positions is obtained from a value-position-mark mapping table;
- corresponding relationships between the first significance marks and the same one of the pipeline positions are constructed;
- a heating mapping file is established based on all the corresponding relationships.

In this embodiment, label array =

$$\begin{Bmatrix} \text{position 1} & \text{first heating label} & \text{position 2} & \text{first heating label} \\ \text{position 1} & \text{second heating label} & \text{position 2} & \text{second heating label} \end{Bmatrix} \cdots$$

In this embodiment, the temperature analysis is mainly to determine whether the temperature is reasonable or not, and the temperature reasonable value is calculated.

In this embodiment, the value-position-mark mapping table includes different temperature reasonable values, pipeline locations and corresponding marks, mainly to effectively show the situation of the location.

In this embodiment, the corresponding relationship is that each pipeline position in the label array has a mark, which is convenient for subsequent display on the initial image.

In this embodiment, the heating mapping file includes all the corresponding relationships, and the pipeline positions and marks matched with the corresponding relationships.

The above technical scheme has the following beneficial effects: the temperature reasonable value is determined by constructing the label array and analyzing the temperature of the same pipeline position, and then the mark of the corresponding position is effectively determined through the mapping table, thus ensuring the integrity and accuracy of the establishment of the heating mapping file, providing an effective basis for detection and ensuring the detection efficiency.

The disclosure provides the image construction method for a heating area, establishing a display index of the heating mapping file, and attaching the display index to the initial image to obtain a heating image of the heating area includes:
- hidden relationships between a first significance label of each the same one of the pipeline positions and a displayed click position in the heating mapping file are determined;
- the display index of the heating mapping file is established according to all the hidden relationships;
- the display index is attached to a hidden layer of the initial image to obtain the heating image of the heating area.

In this embodiment, after the heating mapping file is constructed, it is necessary to display the mark of the corresponding position in combination with clicking the corresponding position with the mouse, so it is necessary to establish the hidden relationship between the label and the displayed clicking position, that is to say, to establish a connection, the display index file is a synthesis of all hidden relationships, that is, based on the display index, hidden relationships can be further explored.

In this embodiment, the hidden layer refers to the capacitive medium layer, mainly for the convenience of touch control.

The technical scheme has the following beneficial effects: by establishing the hidden relationship and the display index, it can be displayed in a targeted manner when it is convenient to view, further the detection efficiency and the timely processing efficiency is improved.

Figure 2:
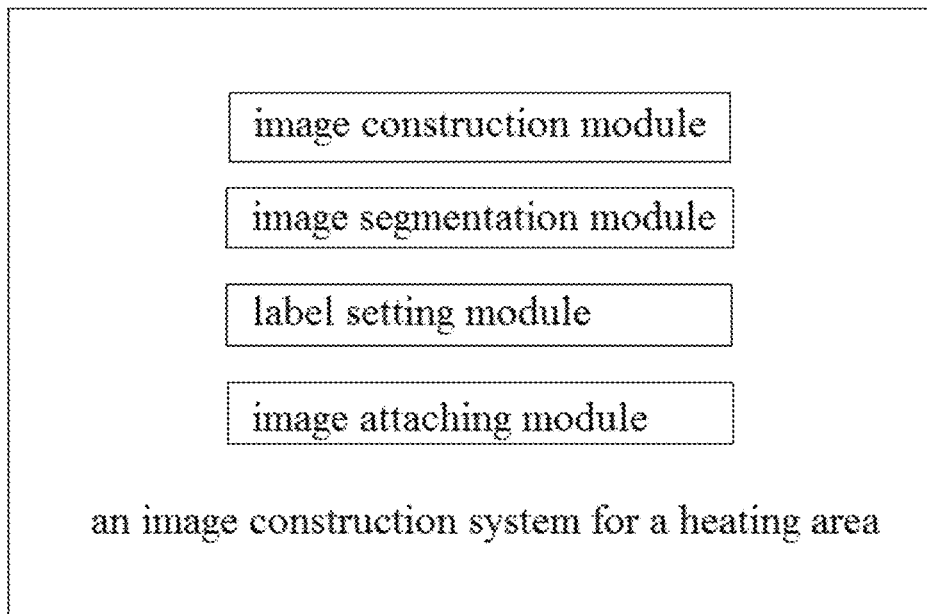
FIG. 2 is a structural diagram of an image construction system for a heating area according to embodiments of the disclosure.

The disclosure provides an image construction system for a heating area, as shown in FIG. 2, including:
- an image construction module configured for performing image fusion to obtain an initial image of the heating area according to a heating structure diagram and a building structure diagram of the heating area;
- an image segmentation module configured for segmenting the initial image according to heating attribute of the heating area to obtain a plurality of segmentation sub-graphs;

a label setting module configured for performing first collection on a surface temperature of a heating pipeline according to pre-deployed surface devices corresponding to the segmentation sub-graphs, and setting first heating labels corresponding to the segmentation sub-graphs, and meanwhile, performing second collection on a regional temperature of a sub-area of the heating pipeline being located according to a pre-deployed monitoring device corresponding to the segmentation sub-graphs, and setting second heating labels;

an image attaching module configured for performing position and temperature analysis on a label setting result of each of the segmentation sub-graphs, establishing a heating mapping file, establishing a display index of the heating mapping file, and attaching the display index to the initial image to obtain a heating image of the heating area.

The technical scheme has the following beneficial effects: the different labels are respectively set by collecting the surface temperature of a pipeline and the regional temperature of the area where the pipeline is located. And labels are attached and indexes are established on the corresponding images, so that the whole running situation of the pipeline can be viewed in time, and the detection efficiency of the pipeline can be improved conveniently.

Obviously, those skilled in the art can make various modifications and variations to the disclosure without departing from the spirit and scope of the disclosure. Thus, if these modifications and variations of the disclosure are within the scope of the claims of the disclosure and their technical equivalents, the disclosure is also intended to include these modifications and variations.

What is claimed is:

1. An image construction method for a heating area, wherein the method comprises:
    S1, performing image fusion to obtain an initial image of the heating area according to a heating structure diagram and a building structure diagram of the heating area;
    S2, segmenting the initial image according to heating attribute of the heating area to obtain a plurality of segmentation sub-graphs;
    S3, performing first collection on a surface temperature of a heating pipeline by a plurality of first temperature sensors corresponding to the segmentation sub-graphs, and setting first heating labels corresponding to the segmentation sub-graphs, and meanwhile, performing second collection on a regional temperature of a sub-area of the heating pipeline being located by a second temperature sensor corresponding to the segmentation sub-graphs, and setting second heating labels;
    S4, performing position and temperature analysis on a label setting result of each of the segmentation sub-graphs, establishing a heating mapping file, establishing a display index of the heating mapping file, and attaching the display index to the initial image to obtain a heating image of the heating area;
    wherein the segmenting the initial image according to heating attribute of the heating area to obtain a plurality of segmentation sub-graphs comprises:
    based on the initial image, performing a first determination on pipeline nodes of the heating pipeline, bifurcation connection information and bifurcation trend information of each of the pipeline nodes to obtain a first determination result, and performing a second determination on heating intention of each pipeline segment in the heating pipeline to obtain a second determination result;
    constructing a first array of each the pipeline segment according to the first determination result and the second determination result;
    determining whether a segment position of each the pipeline segment is an end point, and if so, adding an object parameter to the first array of corresponding pipeline segment to obtain a second array of corresponding pipeline segment;
    otherwise, keeping the first array unchanged;
    respectively inputting the first array and the second array into an array analysis model to obtain a segment state of each pipeline segment, and obtaining a continuous and consistent first state and an independent second state;
    segmenting the initial image according to matching positions of the first state and the second state to obtain the plurality of segmentation sub-graphs;
    wherein the first array is: [the bifurcation connection information, the bifurcation trend information, the heating intention];
    the second array is: [the bifurcation connection information, the bifurcation trend information, the heating intention, the object parameter];
    wherein the array analysis model is pre-trained, and is obtained by training different array combinations and a pipeline state matched with corresponding one of the combinations as a sample;
    wherein the performing first collection on a surface temperature of a heating pipeline by the plurality of first temperature sensors corresponding to the segmentation sub-graphs, and setting first heating labels corresponding to the segmentation sub-graphs comprises:
    controlling each of the plurality of first temperature sensors in a same one of the segmentation sub-graphs to collect a surface temperature at a corresponding position for n1 times, and constructing a first temperature matrix, wherein row vector of the first temperature matrix is a temperature value of n1 times collected by same one of the plurality of first temperature sensors, and column vector of the first temperature matrix is a temperature value collected by different first temperature sensors at a same time;
    performing row fitting on the first temperature matrix to obtain first fitting values, and simultaneously performing column fitting on the first temperature matrix to obtain second fitting values;
    calculating a first standard deviation of all the first fitting values, a second standard deviation of all the second fitting values and a third standard deviation of all the first fitting values and all the second fitting values;
    respectively obtaining fitting lines of absolute values of differences between the first standard deviation and the second standard deviation, the first standard deviation and the third standard deviation, and the second standard deviation and the third standard deviation;
    if the fitting lines are same horizontally fitted, obtaining average temperatures of all the first fitting values and the second fitting values, and setting the first heating labels corresponding to the segmentation sub-graphs;
    if the fitting lines are not horizontally fitted, extracting a temperature measurement result corresponding to a first segment from the first temperature matrix according to a segmentation trend of each first segment in the segmentation sub-graphs to obtain an initial sub-matrix;

removing a first row vector and a last row vector of the initial sub-matrix to obtain a first sub-matrix;

when the initial sub-matrix is consistent with feature information of the first sub-matrix, determining first temperatures to be marked corresponding to the first segment and a first position to be marked for each of the first temperatures to be marked according to a line state of a first line corresponding to the initial sub-matrix, to set a first sub-label for corresponding to the first segment;

when the initial sub-matrix is inconsistent with the feature information of the first sub-matrix, obtaining input water flow combination information corresponding to the first segment and performing first filling on the first row vector of the first sub-matrix, and performing second filling on the last row vector of the first sub-matrix according to the output water flow combination information corresponding to the first segment;

if a filled sub-matrix is consistent with feature information of a corresponding initial sub-matrix, determining a second temperature to be marked corresponding to the first segment and the second position to be marked for each second temperature according to a heating influence state of the input water flow combination information and the output water flow combination information, the line state of the first line corresponding to the initial sub-matrix and a line state of a second line corresponding to the first sub-matrix, to set a second sub-label for the corresponding first segment;

if the filled sub-matrix is inconsistent with the feature information of the corresponding initial sub-matrix, obtaining adjacent temperatures of adjacent segments connected with corresponding the first segment and averaging the adjacent temperatures, to set a third sub-label for corresponding the first segment;

according to a setting result of each first segment in same one of the segmentation sub-graphs, obtaining the first heating labels corresponding to the segmentation sub-graphs;

wherein the performing position and temperature analysis on a label setting result of each of the segmentation sub-graphs, and establishing a heating mapping file comprises:

obtaining all the first heating labels and all the second heating labels of each pipeline segment in same one of the segmentation sub-graphs, and constructing and obtaining a label array of corresponding pipeline segment;

performing temperature analysis on labels of same one of pipeline positions in the label array to calculate temperature reasonable values;

$$W1 = \left| \delta 1 \times \frac{G1 - Gc}{\Delta L1} \right| + \left| \delta 2 \times \frac{G1 - G2}{\Delta L2} \right|;$$

wherein G1 represents a temperature value corresponding to each of the first heating labels at same one of the pipeline positions; Gc represents a temperature value corresponding to each of the first heating labels with a nearest adjacent distance from the same one of the pipeline positions in a same pipeline segment; G2 represents a temperature value corresponding to each of the second heating labels at the same one of the pipeline positions; $\Delta L2$ represents a temperature attenuation function at a distance L2 between a pipeline surface measurement point and an external area measurement point in a spatial vertical direction of the same one of the pipeline positions; $\Delta L1$ represents a temperature attenuation function of two pipeline surface measurement points in a spatial horizontal direction at a distance L1; $\delta 1$ represents setting weight of horizontal attenuation; $\delta 2$ represents setting weight of vertical attenuation; W1 represents corresponding temperature reasonable values;

according to the temperature reasonable values and position importance of the same one of the pipeline positions, obtaining first significance marks of the same one of the pipeline positions from a value-position-mark mapping table;

constructing corresponding relationships between the first significance marks and the same one of the pipeline positions;

establishing a heating mapping file based on all the corresponding relationships;

wherein the value-position-mark mapping table comprises different temperature reasonable values, pipeline positions and corresponding marks.

2. The image construction method for a heating area according to claim 1, wherein the performing image fusion to obtain an initial image of the heating area according to the heating structure diagram and the building structure diagram of the heating area comprises:

obtaining a first scaling ratio of the heating structure diagram of the heating area and obtaining a second scaling ratio of the building structure diagram of the heating area;

performing same scale processing on the first scaling scale and the second scaling scale, and performing position fusion on a same scale heating diagram and a same scale building diagram to obtain the initial image.

3. The image construction method for a heating area according to claim 1, wherein the performing second collection on a regional temperature of a sub-area of the heating pipeline being located by a second temperature sensor corresponding to the segmentation sub-graphs and setting second heating labels comprises:

collecting a same external area temperature of each pipeline segment in the heating pipeline for n2 times based on the second temperature sensor;

performing fitting processing on collection results of the same external area temperature, and setting the second heating labels to a corresponding same external area.

4. The image construction method for a heating area according to claim 1, wherein the establishing a display index of the heating mapping file, and attaching the display index to the initial image to obtain a heating image of the heating area comprises:

determining hidden relationships between a first significance label of each the same one of the pipeline positions and a displayed click position in the heating mapping file;

establishing the display index of the heating mapping file according to all the hidden relationships;

attaching the display index to a hidden layer of the initial image to obtain the heating image of the heating area.

* * * * *